United States Patent
Kon (10) Patent No.: US 11,480,748 B2
(45) Date of Patent: Oct. 25, 2022

(54) OPTICAL RECEPTACLE AND OPTICAL MODULE

(71) Applicant: Enplas Corporation, Saitama (JP)

(72) Inventor: Ayano Kon, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 17/268,103

(22) PCT Filed: Aug. 9, 2019

(86) PCT No.: PCT/JP2019/031617
§ 371 (c)(1),
(2) Date: Feb. 12, 2021

(87) PCT Pub. No.: WO2020/036140
PCT Pub. Date: Feb. 20, 2020

(65) Prior Publication Data
US 2021/0341693 A1 Nov. 4, 2021

(30) Foreign Application Priority Data
Aug. 14, 2018 (JP) .............................. JP2018-152641

(51) Int. Cl.
*G02B 6/42* (2006.01)

(52) U.S. Cl.
CPC .......... *G02B 6/4286* (2013.01); *G02B 6/4214* (2013.01)

(58) Field of Classification Search
CPC ............................ G02B 6/4214; G02B 6/4286
(Continued)

(56) References Cited

U.S. PATENT DOCUMENTS 6,895,147 B2 * 5/2005 Posamentier ........ G02B 6/4214
385/47
9,164,247 B2 * 10/2015 Amit .................... G02B 6/4201
(Continued)

FOREIGN PATENT DOCUMENTS

| CN | 102640369 B | * 5/2016 | ........... G02B 6/4206 |
| JP | 2013-024918 A | 2/2013 | |
| JP | 2015-179125 A | 10/2015 | |

OTHER PUBLICATIONS

Ian Aeby, et al., "VCSELs for high speed data communication in TO packages, pushing the envelope", Proceedings of SPIE vol. 5737, p. 91-100.
(Continued)

*Primary Examiner* — Kaveh C Kianni
(74) *Attorney, Agent, or Firm* — Brundidge & Stanger, P.C.

(57) ABSTRACT

This optical receptacle comprises: a first optical surface on which light emitted from a VCSEL is incident; a first reflection part which reflects, as monitor light traveling to a detection element; a light separation part which separates monitor light and signal light; a second optical surface which emits the signal light to the end surface of the optical transmission body; and a third optical surface which emits the monitor light reflected by the first reflection part and the monitor light separated by the light separation part to the detection element. Two second reflection parts of the light separation part are disposed so as to be located within a luminous flux of the light incident on the first optical surface such that a predetermined condition is satisfied.

4 Claims, 10 Drawing Sheets

(58) Field of Classification Search
USPC .......................................................... 385/31
See application file for complete search history.

(56) References Cited

U.S. PATENT DOCUMENTS

| | | | | |
|---|---|---|---|---|
| 9,733,438 | B2* | 8/2017 | Yu | G02B 6/4206 |
| 9,869,818 | B2* | 1/2018 | Tang | G02B 6/4295 |
| 9,891,385 | B2* | 2/2018 | Tang | G02B 6/3825 |
| 9,995,880 | B1* | 6/2018 | Ding | G02B 6/29367 |
| 10,088,639 | B2* | 10/2018 | Mentovich | G02B 6/4206 |
| 10,222,474 | B1* | 3/2019 | Raring | H01S 5/0087 |
| 10,698,167 | B2* | 6/2020 | DeMeritt | G02B 6/423 |
| 2004/0264881 | A1* | 12/2004 | Posamentier | G02B 6/4214 |
| | | | | 385/88 |
| 2005/0147353 | A1* | 7/2005 | Vancoill | G02B 6/4204 |
| | | | | 385/47 |
| 2010/0265974 | A1* | 10/2010 | Wang | H01S 5/4025 |
| | | | | 372/38.01 |
| 2014/0133802 | A1 | 5/2014 | Morioka | |
| 2016/0238794 | A1* | 8/2016 | Tang | G02B 6/4214 |
| 2016/0341903 | A1* | 11/2016 | Tang | G02B 6/4246 |
| 2017/0097477 | A1 | 4/2017 | Shibuya | |
| 2017/0131488 | A1* | 5/2017 | Yu | G02B 6/421 |

OTHER PUBLICATIONS

International Search Report from International Application No. PCT/JP2019/031617, dated Oct. 8, 2019.

\* cited by examiner

OPTICAL RECEPTACLE AND OPTICAL MODULE

TECHNICAL FIELD

The present invention relates to an optical receptacle and an optical module.

BACKGROUND ART

In the related art, an optical module including a light-emitting element such as a vertical-cavity surface-emitting laser (VCSEL) is used in optical communication using an optical transmission member such as an optical fiber and a light waveguide. The optical module includes an optical receptacle for entering, into an end surface of the optical transmission member, light including communication information emitted from light-emitting element.

In addition, for the purpose of adjusting the output light or stabilizing the output characteristics of a light emitting element against temperature variation, some optical modules include a detection element for checking (monitoring) the intensity and the quantity of the light emitted from the light emitting element.

For example, PTL 1 discloses an optical module including a photoelectric conversion device including a light emitting element and a detection element, and an optical receptacle configured to optically connect the light emitting element and an end surface of an optical transmission member. The optical receptacle includes a first surface configured to allow incidence of light emitted from the light-emitting element, a first reflection surface configured to reflect light entered from the first surface toward the end surface of the optical transmission member, a transmission part configured to transmit a part of light reflected by the first reflection surface as signal light travelling toward the end surface of the optical transmission member, a second reflection surface configured to reflect a remaining part of the light reflected by the first reflection surface, as monitor light travelling toward the detection device, a second surface configured to emit signal light transmitted through the transmission part such that the light is focused at the end surface of the optical transmission member, and a third lens surface configured to emit the monitor light reflected by the second reflection surface toward the detection device.

In the optical module disclosed in PTL 1, light emitted from the light-emitting element is entered from the first surface. The light entered from the first surface is reflected by the first reflection surface. A part of the light reflected by the first reflection surface passes through the transmission part as signal light, and the remaining part of the light is reflected by the second reflection surface as monitor light. The signal light transmitted through the transmission part is emitted from the second surface toward the end surface of the optical transmission member. On the other hand, the monitor light reflected by the second reflection surface is emitted from the third lens surface toward the light reception surface of the detection device.

In addition, it is known that the distribution of the light intensity of a vertical-cavity surface-emitting laser differs depending on the intensity of the current (e.g., see NPTL 1). NPTL 1 discloses a graph (curve) showing a relationship between the emission angle of the vertical-cavity surface-emitting laser and the light intensity.

Figure 1:
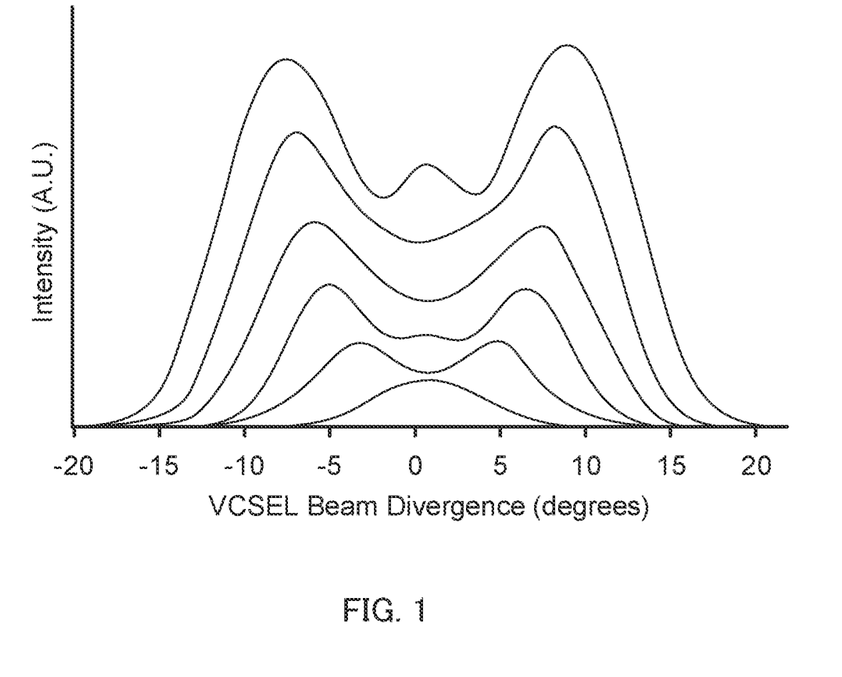
FIG. 1 is a graph illustrating a modified FIG. 11 of NPTL 1.

FIG. 1 is a schematic graph showing a modified FIG. 11 of NPTL 1. Lower curves indicate light intensity distributions with small current values, and upper curves indicate light intensity distributions with small current values. As illustrated in FIG. 1, in a vertical-cavity surface-emitting laser, the curve has a unimodal distribution when the current is small, and the curve has a bimodal distribution when a large current is used. The difference between the top and the bottom of the curve increases as the value of the current increases.

CITATION LIST

Patent Literature

PTL 1
Japanese Patent Application Laid-Open No. 2013-24918

Non-Patent Literature

NPL 1
Ian Aeby, et al., "VCSELs for high speed data communication in TO packages, pushing the envelope", Proceedings of SPIE, Vol. 5737, p. 91-100.

SUMMARY OF INVENTION

Technical Problem

However, when a vertical-cavity surface-emitting laser is used as a light-emitting element in the optical module disclosed in PTL 1, the ratio between the signal light and the monitor light largely varies as the current supplied through the vertical-cavity surface-emitting laser changes. Consequently, sufficient light cannot arrive at the detection device, and the output of the light emitted from the light-emitting element (vertical-cavity surface-emitting laser) cannot be appropriately monitored.

An object of the present invention is to provide an optical module and an optical receptacle used for the optical module that can appropriately monitor the output of the light emitted from the vertical-cavity surface-emitting laser even when the current supplied through the vertical-cavity surface-emitting laser is changed.

Solution to Problem

An optical receptacle according to an embodiment of the present invention is configured to optically couple a vertical-cavity surface-emitting laser and an end surface of an optical transmission member in a state where the optical receptacle is disposed between the optical transmission member and the photoelectric conversion device, the photoelectric conversion device including the vertical-cavity surface-emitting laser and a detection device configured to monitor light emitted from the vertical-cavity surface-emitting laser, the optical receptacle including a first optical surface configured to allow incidence of light emitted from the vertical-cavity surface-emitting laser; a first reflection part configured to reflect, as monitor light travelling toward the detection device, a part of light entered from the first optical surface; a light separation part configured to separate another part of the light entered from the first optical surface into monitor light travelling toward the detection device and signal light travelling toward the end surface of the optical transmission member; a second optical surface configured to emit, toward the end surface of the optical transmission member, the signal light separated at the light separation part; and a third optical surface configured to emit, toward the detection device, the monitor light reflected by the first reflection part and the monitor light separated at the light separation part.

The light separation part includes: two second reflection parts tilted to an optical axis of the light entered from the first optical surface, the two second reflection parts being configured to reflect a part of light incident on the light separation part toward the third optical surface as the monitor light travelling toward the detection device, and a transmission part disposed at least between the two second reflection parts, and configured to transmit, as the signal light, another part of the light incident on the light separation part. The two second reflection parts are disposed within a light flux of the light entered from the first optical surface to satisfy a following installation method of the two second reflection parts, the installation method of the two second reflection parts of the two second reflection parts including:

(1) determining a first curve, the first curve representing a relationship between an angle to a normal passing through a center of a light-emitting surface of the vertical-cavity surface-emitting laser in a cross-section that includes the normal and is parallel to an arrangement direction of the two second reflection parts, and a light intensity of light emitted from the light-emitting surface when a maximum available current is applied to the vertical-cavity surface-emitting laser, wherein a direction along the normal is set to 0° in the cross-section;

(2) determining a first maximum value and a second maximum value in the first curve, the first maximum value being a maximum value of a light intensity in a minus region of the angle, the second maximum value being a maximum value of a light intensity in a plus region of the angle, wherein in the first curve, the angle to the normal on one side with respect to the normal in the cross-section is set as minus, and the angle to the normal on another side with respect to the normal in the cross-section is set as plus;

(3) determining a second curve, the second curve representing a relationship between the angle to the normal in the cross-section and the light intensity of the light emitted from the vertical-cavity surface-emitting laser when an available minimum current is applied to the vertical-cavity surface-emitting laser, wherein the direction along the normal is set to 0°;

(4) determining a first minimum difference angle, the first minimum difference angle being an angle corresponding to a state where a difference between a light intensity in the first curve and a light intensity in the second curve is smallest in a range from an angle of 0° to an angle corresponding to the first maximum value;

(5) determining a second minimum difference angle, the second minimum difference angle being an angle corresponding to a state where a difference between the light intensity in first curve and the light intensity in second curve is smallest in a range from the angle of 0° to an angle corresponding to the second maximum value; and (6) disposing the two second reflection parts at arrival positions of light emitted at the first minimum difference angle and light emitted at the second minimum difference angle.

An optical module according to an embodiment of the present invention includes: a photoelectric conversion device including a substrate, a vertical-cavity surface-emitting laser disposed on the substrate, and a detection device disposed on the substrate and configured to monitor emission light emitted from the vertical-cavity surface-emitting laser;

and the above-mentioned optical receptacle.

Advantageous Effects of Invention

According to the present invention, it is possible to provide an optical module that can appropriately monitor the output of the light emitted from the vertical-cavity surface-emitting laser even when the current supplied through the vertical-cavity surface-emitting laser is changed.

DESCRIPTION OF EMBODIMENTS

Embodiments according to the present invention are described in detail below with reference to the accompanying drawings.

Embodiment 1

Configuration of Optical Module

Figure 2:
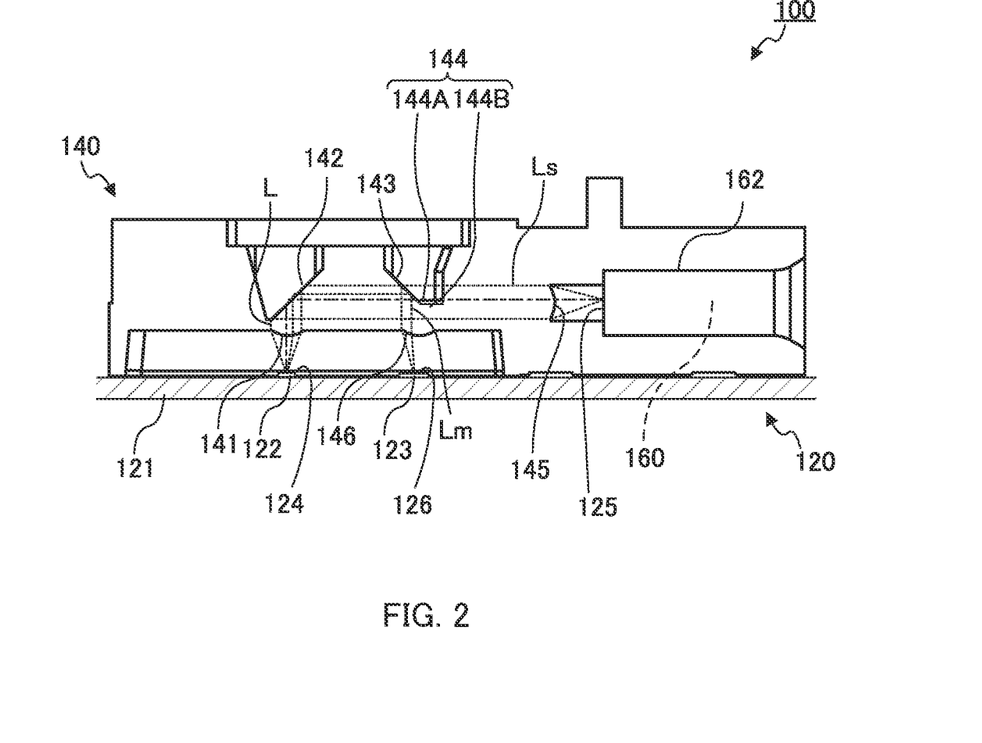
FIG. 2 is a sectional view of an optical module according to Embodiment 1.

FIG. 2 is a sectional view of optical module 100 according to Embodiment 1. FIG. 1 illustrates light paths in optical module 100. Note that, in FIG. 1, the hatching on the cross-section of optical receptacle 140 is omitted to illustrate light paths inside optical receptacle 140.

As illustrated in FIG. 2, optical module 100 includes substrate-mounting type photoelectric conversion device 120 including vertical-cavity surface-emitting laser (VCSEL) 122 serving as a light-emitting element, and optical receptacle 140. Optical module 100 is a transmission optical module, and is used with optical transmission member 160 coupled (hereinafter referred to also as "connected") to optical receptacle 140 through ferrule 162. The type of optical transmission member 160 is not limited, and examples of the type include optical fibers and light waveguides. In the present embodiment, optical transmission member 160 is an optical fiber. The optical fiber may be of a single-mode type, or a multiple-mode type. The number of optical transmission members 160 is not limited. In the present embodiment, one optical transmission member 160 is provided.

Photoelectric conversion device 120 includes substrate 121, one vertical-cavity surface-emitting laser 122, and one detection device 123.

Substrate 121 is a glass composite substrate, a glass epoxy substrate, or a flexible substrate, for example. Vertical-cavity surface-emitting laser 122 and detection device 123 are disposed on substrate 121.

Vertical-cavity surface-emitting laser 122 is disposed on substrate 121, and emits laser light in a direction perpendicular to substrate 121. The number of vertical-cavity surface-emitting lasers 122 is not limited. In the present embodiment, one vertical-cavity surface-emitting laser 122 is provided. Also, the position of vertical-cavity surface-emitting laser 122 is not limited.

Detection device 123 receives monitor light Lm for monitoring the output (e.g., the intensity and/or the quantity) of emission light L emitted from vertical-cavity surface-emitting laser 122. Detection device 123 is a photodetector, for example. The number of detection devices 123 is not limited, and is the same as the number of vertical-cavity surface-emitting lasers 122, for example. In the present embodiment, one detection device 123 is provided. In addition, from the viewpoint of preventing reflection light of detection device 123 from returning back to optical receptacle 140, the optical axis of monitor light Lm incident on detection device 123 may be tilted to light reception surface 126 of detection device 123.

Optical receptacle 140 is disposed on substrate 121 of photoelectric conversion device 120. Optical receptacle 140 optically couples light-emitting surface 124 of vertical-cavity surface-emitting laser 122 and end surface 125 of optical transmission member 160 in the state where optical receptacle 140 is disposed between photoelectric conversion device 120 and optical transmission member 160. A configuration of optical receptacle 140 is described in detail below.

Configuration of Optical Receptacle

Figure 3:
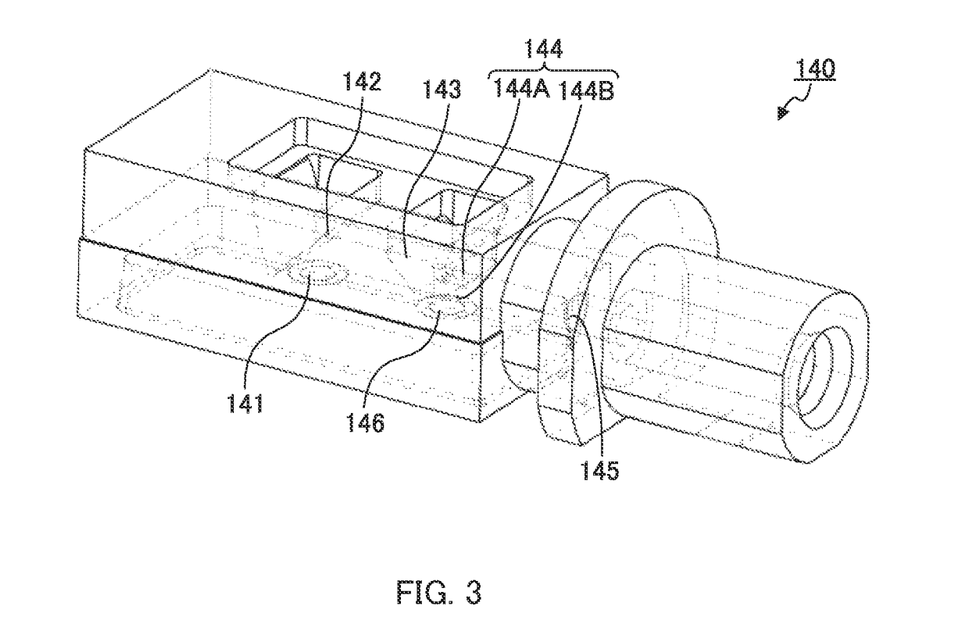
FIG. 3 is a perspective view of an optical receptacle according to Embodiment 1.
Figure 4A:
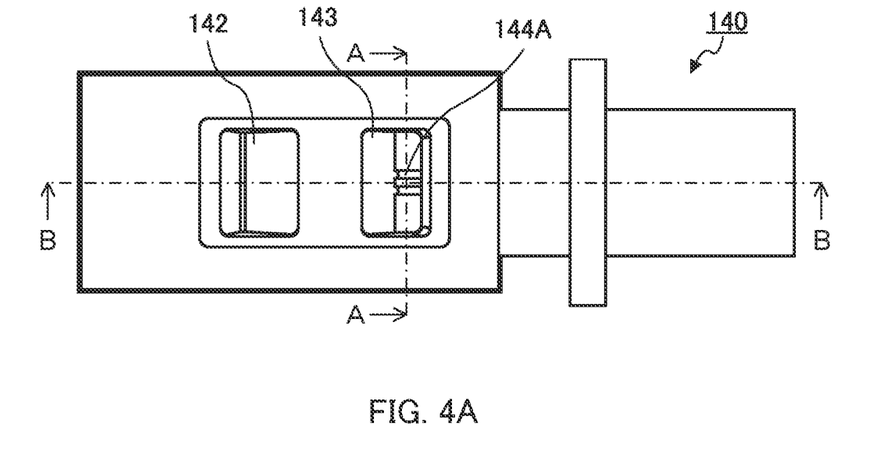
FIGS. 4A to 4D illustrate a configuration of the optical receptacle according to Embodiment 1.
Figure 4B:
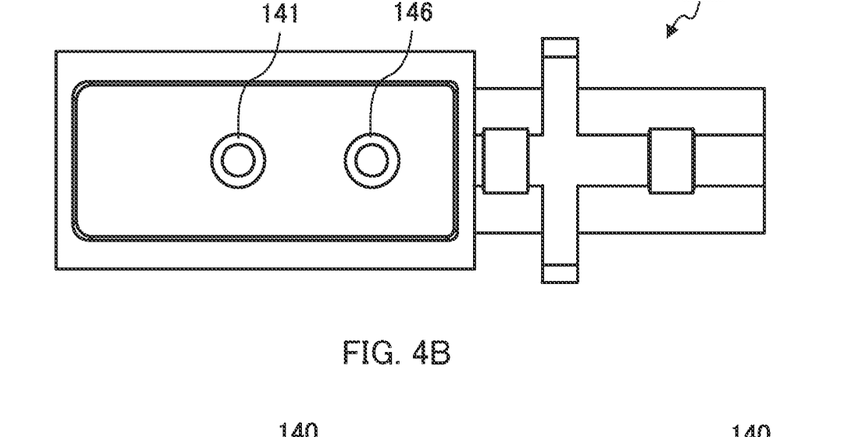
Figure 4C:
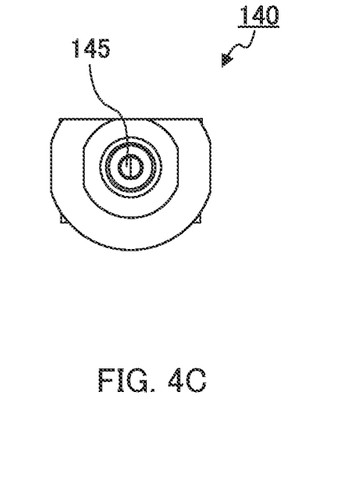
Figure 4D:
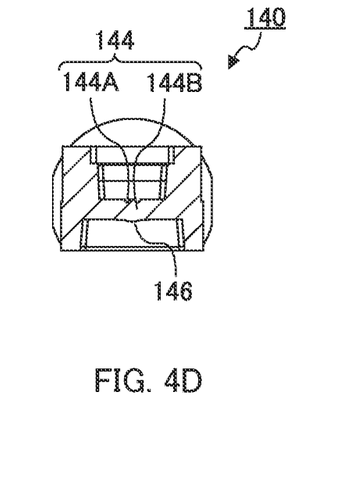
Figure 5:
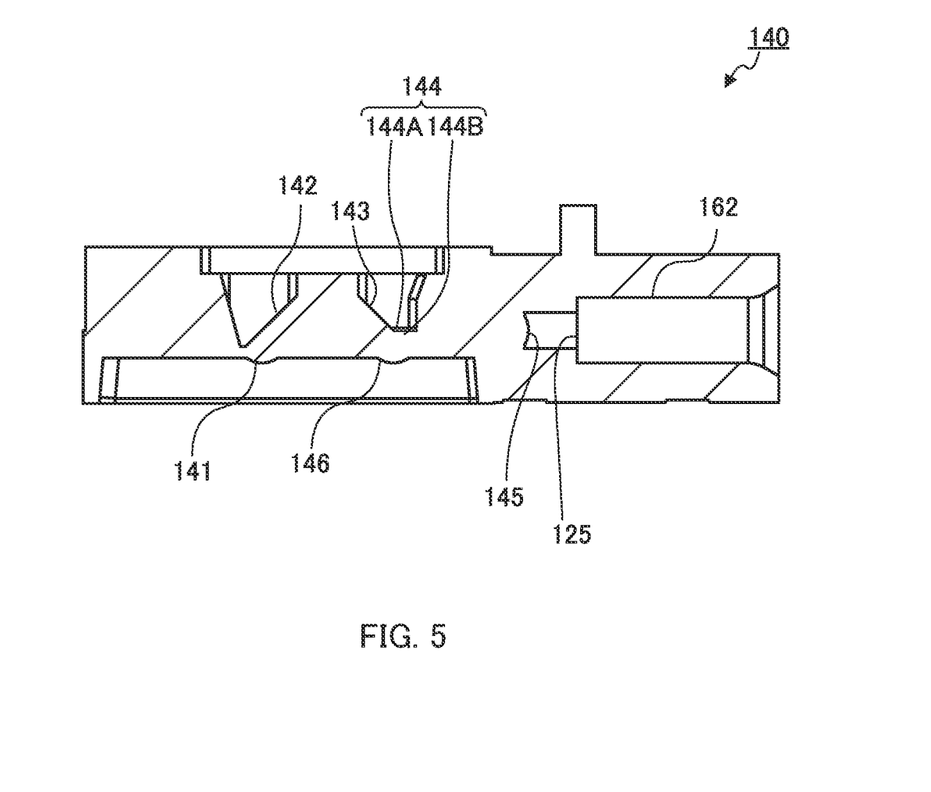
FIG. 5 is a sectional view of the optical receptacle according to Embodiment 1.

FIGS. 3 to 5A illustrate a configuration of optical receptacle 140 according to the present embodiment. FIG. 3 is a perspective view of optical receptacle 140, FIG. 4A is a plan view of optical receptacle 140 according to Embodiment 1, FIG. 4B is a bottom view, FIG. 4C is a right side view, and FIG. 4D is a sectional view taken along line A-A of FIG. 4A. FIG. 5 is a sectional view taken along line B-B of FIG. 4A.

As illustrated in FIGS. 3 to 5, optical receptacle 140 is optically transparent. Optical receptacle 140 emits a part of emission light L emitted from light-emitting surface 124 of vertical-cavity surface-emitting laser 122 toward end surface 125 of optical transmission member 160 as signal light Ls, and emits another part of the emission light L toward detection device 123 as monitor light Lm. Optical receptacle 140 includes first optical surface 141, reflection surface 142, first reflection part 143, light separation part 144, second optical surface 145, and third optical surface 146. Light separation part 144 includes second reflection part 144A and transmission part 144B. In the present embodiment, one first optical surface 141, one first reflection part 143, one transmission part 144B, one second optical surface 145, and one third optical surface 146 are provided. In addition, in the present embodiment, two second reflection parts 144A are provided.

Optical receptacle 140 is formed using a material having a transparency to light of the wavelength used in optical communications. Examples of such a material include transparent resins such as polyetherimide (PEI) and cyclic olefin resin. In addition, for example, optical receptacle 140 is manufactured by injection molding.

First optical surface 141 is an optical surface that refracts emission light L emitted from vertical-cavity surface-emitting laser 122 to enter the emission light L into optical receptacle 140. First optical surface 141 can convert emission light L emitted from vertical-cavity surface-emitting laser 122 into collimated light, converged light, or diffused light. In the present embodiment, first optical surface 141 converts emission light L emitted from vertical-cavity surface-emitting laser 122 into collimated light. In the present embodiment, the shape of first optical surface 141 is a convex lens surface protruding toward vertical-cavity surface-emitting laser 122. In addition, in plan view, first optical surface 141 has a circular shape. Preferably, the central axis of first optical surface 141 is perpendicular to light-emitting surface 124 of vertical-cavity surface-emitting laser 122. In addition, preferably, the central axis of first optical surface 141 is coincide with the optical axis of emission light L emitted from vertical-cavity surface-emitting laser 122.

Reflection surface 142 is a tilted surface formed on the top surface side of optical receptacle 140, and is disposed on the light path between first optical surface 141 and first reflection part 143 and on the light path between first optical surface 141 and light separation part 144. Reflection surface 142 reflects, toward first reflection part 143 and light separation part 144, light (emission light L emitted from vertical-cavity surface-emitting laser 122) entered from first optical surface 141. Reflection surface 142 is tilted such that the distance to optical transmission member 160 decreases in the direction from the bottom surface toward the top surface of optical receptacle 140. In the present embodiment, the inclination angle of reflection surface 142 is 45 degrees with respect to the optical axis of emission light L entered from first optical surface 141. Emission light L entered from first optical surface 141 internally impinges on reflection surface 142 at an incident angle greater than the critical angle. In this manner, reflection surface 142 totally reflects incident light L in a direction along the surface of substrate 121.

First reflection part 143 is a region for reflecting a part of light entered from first optical surface 141, as monitor light Lm travelling toward detection device 123. First reflection part 143 is in contact with second reflection part 144A and transmission part 144B of light separation part 144. In the present embodiment, first reflection part 143 is a tilted surface that is tilted toward second optical surface 145 (optical transmission member 160) in the direction from the top surface to the bottom surface of optical receptacle 140. The inclination angle of first reflection part 143 is 45° with respect to the optical axis of the light entered from first optical surface 141. In addition, in the present embodiment, the boundary between first reflection part 143 and light separation part 144 is a straight line (see FIG. 6B).

Light separation part 144 separates another part (preferably, the remaining part) of the light entered from first optical surface 141 into monitor light Lm travelling toward third optical surface 146 (detection device 123) and signal light Ls travelling toward second optical surface 145 (end surface 125 of optical transmission member 160). Light separation part 144 includes second reflection part 144A and transmission part 144B (see FIG. 6B).

Two second reflection parts 144A is disposed on the top surface side of optical receptacle 140 in light separation part 144. Second reflection part 144A is a surface tilted to the optical axis of the light entered from first optical surface 141, and reflects, toward third optical surface 146, a part of the other part of the light incident on light separation part 144. In the present embodiment, second reflection part 144A is a tilted surface tilted toward second optical surface 145 (optical transmission member 160) in the direction from the top surface to the bottom surface of optical receptacle 140. The inclination angle of second reflection part 144A is 45° with respect to the optical axis of the light entered from first optical surface 141. In the present embodiment, the surface of second reflection part 144A and the surface of first reflection part 143 are flush. The shape of second reflection part 144A is not limited. In the present embodiment, second reflection part 144A has a substantially semicircular shape (see FIG. 6B). The installation of second reflection part 144A will be described later.

Transmission part 144B is adjacent to second reflection part 144A, and transmits a part of the other part of the light incident on light separation part 144 (light other than the light reflected by second reflection part 144A), as signal light Ls. Transmission part 144B is disposed at least between two second reflection parts 144A. In the present embodiment, transmission part 144B is disposed not only between two second reflection parts 144A, but also outside and below two second reflection parts 144A. Preferably, transmission part 144B is in contact with first reflection part 143.

Second optical surface 145 is an optical surface that emits, toward end surface 125 of optical transmission member 160, signal light Ls separated at light separation part 144. In the present embodiment, second optical surface 145 is disposed at the front surface of optical receptacle 140 to face end surface 125 of optical transmission member 160. Second optical surface 145 has a shape of a convex lens protruding toward end surface 125 of optical transmission member 160. In this manner, signal light Ls entered from first optical surface 141 and separated at light separation part 144 can be focused, and efficiently connected to end surface 125 of optical transmission member 160.

Third optical surface 146 is disposed on the bottom surface side of optical receptacle 140 in such a manner as to face detection element 123. In the present embodiment, third optical surface 146 is a convex lens surface protruding toward detection device 123. Third optical surface 146 converges monitor light Lm separated at second reflection part 144A of light separation part 144 and emits the light toward detection device 123, with first reflection part 143. In this manner, it is possible to efficiently couple monitor light Lm to detection element 123. The central axis of third optical surface 146 may be perpendicular to or tilted to light reception surface 126 of detection device 123 (substrate 121).

Figure 6A:
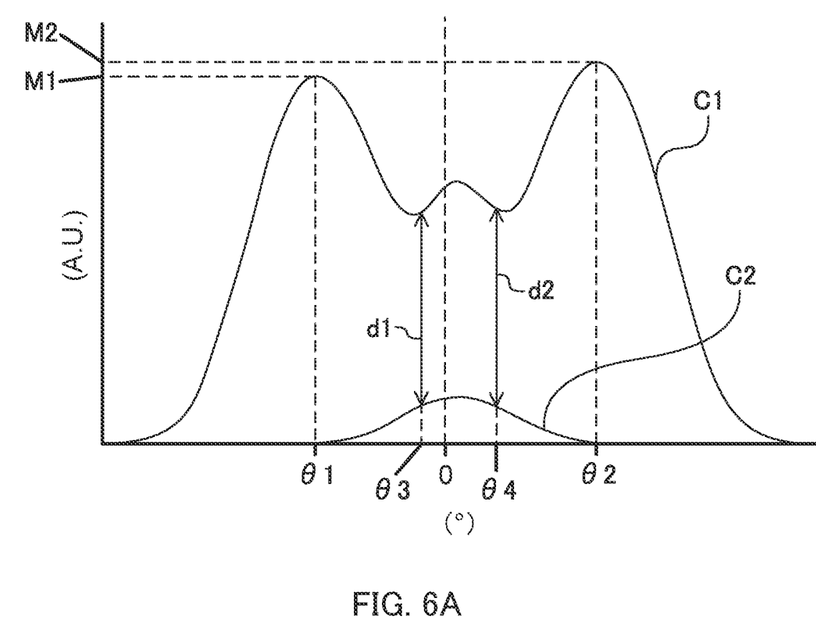
FIGS. 6A and 6B are diagrams for describing an installation method for a second reflection part.
Figure 6B:
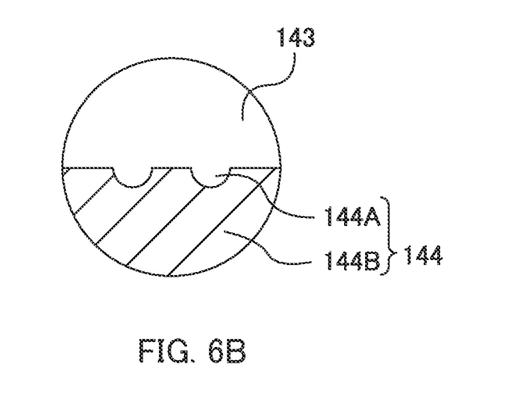

Now, installation of second reflection part 144A is described below. FIGS. 6A and 6B are diagrams for describing an installation direction of second reflection part 144A.
(1) First curve C1 is determined (see FIG. 6A). First curve C1 represents a relationship between the angle to the normal passing through the center of light-emitting surface 124 of vertical-cavity surface-emitting laser 122 in a cross-section that includes the normal and is parallel to the arrangement direction (the depth direction in FIG. 2) of two second reflection parts 144A, and the light intensity of the light emitted from vertical-cavity surface-emitting laser 122 when a maximum available current is applied to vertical-cavity surface-emitting laser 122. Here, a direction along the normal is set to 0°.
(2) First maximum value M1 and second maximum value M2 in first curve C1 are determined. The first maximum value M1 is a maximum value of the light intensity in a minus region of the angle, and the second maximum value M2 is a maximum value of the light intensity in a plus region of the angle. In first curve C1, the angle to the normal on one side (in FIG. 6A, the left side) with respect to the normal in the cross-section is set as minus, and the angle to the normal on the other side (in FIG. 6A, the right side) with respect to the normal in the cross-section is set as plus.
(3) Second curve C2 is determined. Second curve C2 represents a relationship between the angle to the normal in the cross-section and the light intensity of the light emitted from vertical-cavity surface-emitting laser 122 when an available minimum current is applied to vertical-cavity surface-emitting laser 122. Likewise, the direction along the normal is 0°.
(4) First minimum difference d1 is determined, and first minimum difference angle θ3 corresponding to the difference is determined. First minimum difference d1 is a minimum difference between the light intensity in first curve C1 and the light intensity in second curve C2 in a range from the angle 0° to angle θ1 corresponding to first maximum value M1.
(5) Second minimum difference d2 is determined, and second minimum difference angle θ4 corresponding to the difference is determined. Second minimum difference d2 is a minimum difference between the light intensity in first curve C1 and the light intensity in second curve C2 in a range from the angle 0° to angle θ2 corresponding to second maximum value M2.
(6) Two second reflection parts 144A are disposed at arrival positions of light emitted at first minimum difference angle θ3 and second minimum difference angle θ4. Specifically, as illustrated in FIG. 6B, two transmission parts 144B are disposed to transmit the light emitted from vertical-cavity surface-emitting laser 122 at angle θ3 and angle θ4.

Effect

As described above, in optical receptacle 140 of optical module 100 according to the present embodiment, second reflection part 144A for generating monitor light is disposed at the arrival spot of light of an emission angle at which variation of the light intensity due to current variation is small. In this manner, in optical module 100 according to the present embodiment, the quantity of monitor light that reaches detection device 132 can be ensured even when the intensity of light from vertical-cavity surface-emitting laser 122 varies due to current variation, and thus the output of light emitted from vertical-cavity surface-emitting laser 122 can be appropriately monitored.

Embodiment 2

Configuration of Optical Module

Optical module 200 according to Embodiment 2 differs from optical module 100 according to Embodiment 1 in that optical receptacle 240 is of a lens-array type so as to support multichannel (in the present embodiment, four-channel) light transmission. In the following description, the components similar to those of Embodiment 1 are denoted with the same reference numerals and the description thereof will be omitted.

Figure 7:
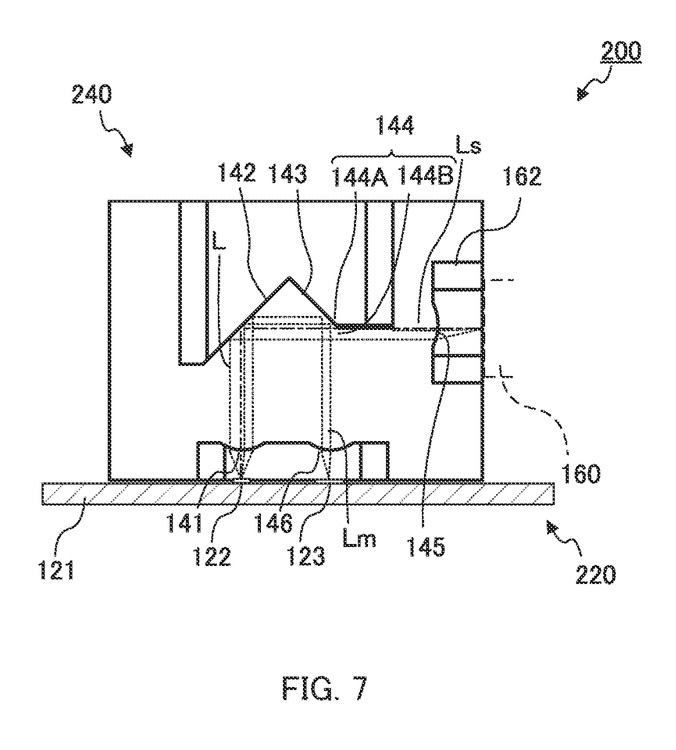
FIG. 7 illustrates a configuration of an optical receptacle according to Embodiment 2.

FIG. 7 is a sectional view of optical module 200 according to Embodiment 2. As illustrated in FIG. 7, optical module 200 includes a substrate-mounting type photoelectric conversion device 220 including vertical-cavity surface-emitting laser 122, and optical receptacle 240.

In optical module 200 according to the present embodiment, optical transmission member 160 is attached to optical receptacle 240 with a publicly known attaching member therebetween in the state where optical transmission member 160 is housed in a multicore collective connector. In the present embodiment, four optical transmission members 160 are arranged in one line at a constant interval. Note that optical transmission members 160 may be disposed in two or more lines.

Photoelectric conversion device 220 includes substrate 121, a plurality of vertical-cavity surface-emitting lasers 122, and a plurality of detection devices 123. The number of vertical-cavity surface-emitting lasers 122 and detection devices 123 are not limited as long as a plurality of the vertical-cavity surface-emitting lasers 122 and a plurality of the detection devices 123 are provided. In the present embodiment, four vertical-cavity surface-emitting lasers 122 and four detection devices 123 are provided.

Four vertical-cavity surface-emitting lasers 122 are arranged on substrate 121 in one line. In FIG. 7, four vertical-cavity surface-emitting lasers 122 are arranged in one line in the depth direction in the drawing. Four vertical-cavity surface-emitting lasers 122 are arranged at a constant interval along the arrangement direction of optical transmission member 160.

Four detection devices 123 are disposed on substrate 121. Four detection devices 123 are arranged in one line at a constant interval in association with four vertical-cavity surface-emitting lasers 122.

Configuration of Optical Receptacle

Figure 8:
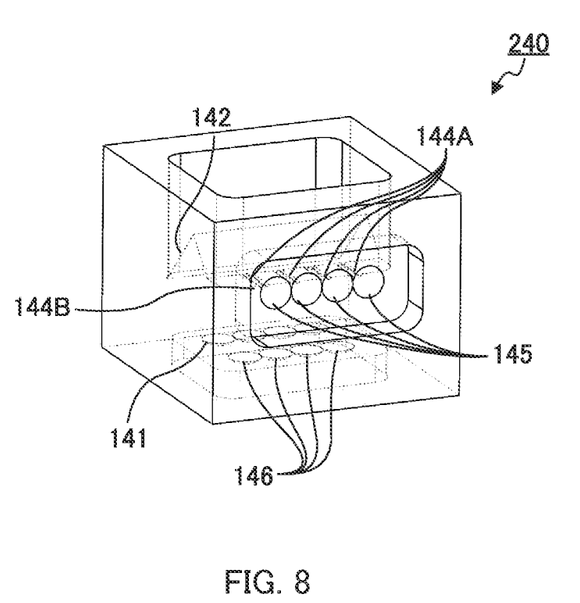
FIG. 8 is a perspective view of the optical receptacle according to Embodiment 2.
Figure 9A:
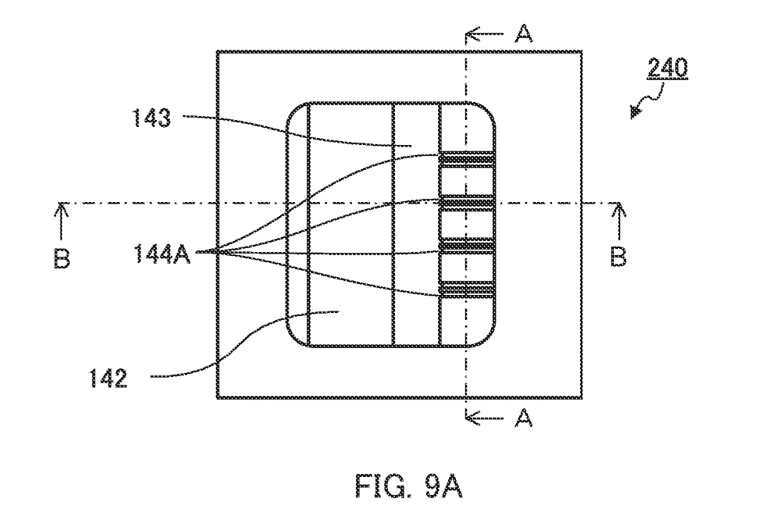
FIGS. 9A to 9C illustrate a configuration of the optical receptacle according to Embodiment 2.
Figure 9B:
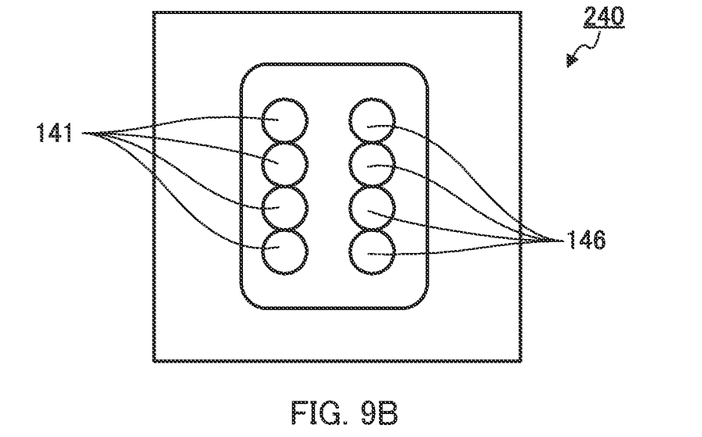
Figure 9C:
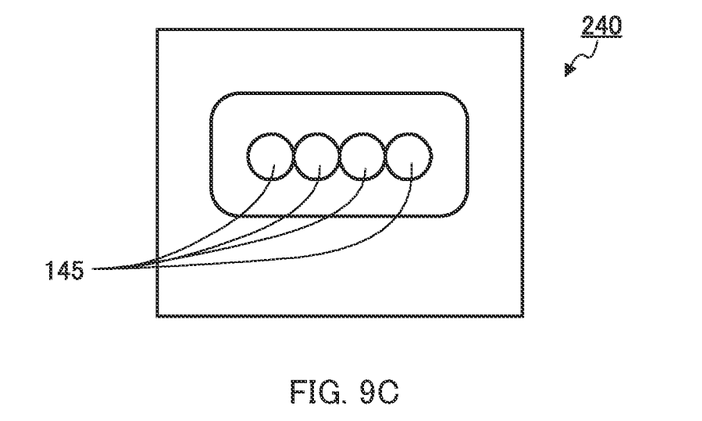
Figure 10A:
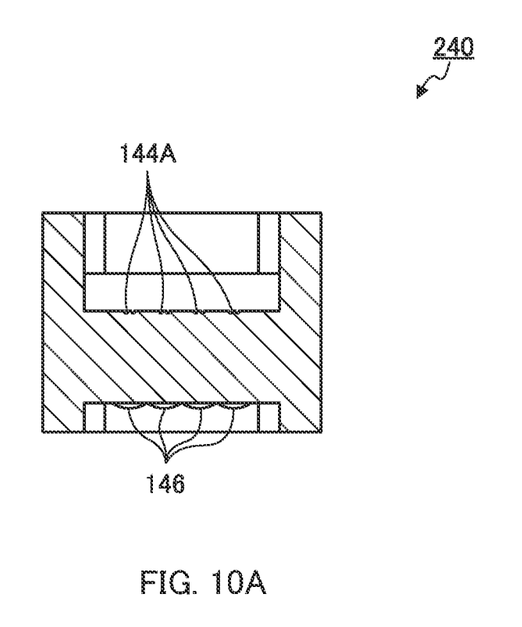
FIGS. 10A and 10B are sectional views of the optical receptacle according to Embodiment 2.
Figure 10B:
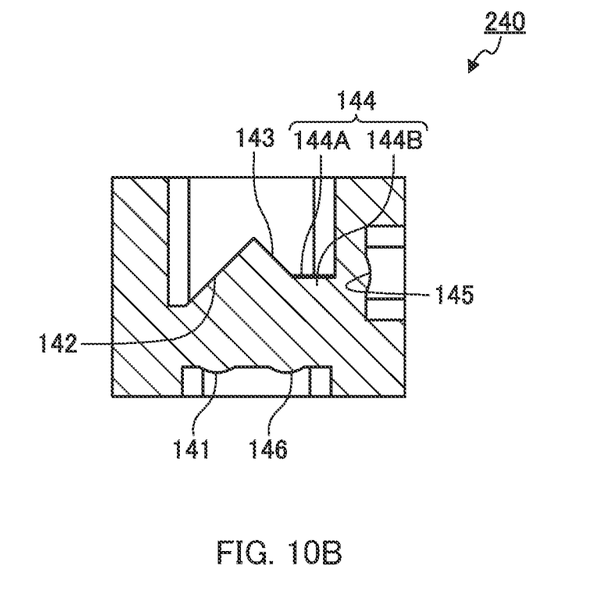

FIGS. 8 to 10B illustrate a configuration of optical receptacle 240 according to the present embodiment. FIG. 8 is a perspective view of optical receptacle 240. FIG. 9A is a plan view of optical receptacle 240, FIG. 9B is a bottom view, and FIG. 9C is a right side view. FIG. 10A is a sectional view taken along line A-A of FIG. 9A, and FIG. 10B is a sectional view taken along line B-B of FIG. 9A.

As illustrated in FIGS. 8 to 10B, optical receptacle 240 according to the present embodiment includes a plurality of first optical surfaces 141, reflection surface 142, a plurality of first reflection parts 143, a plurality of second reflection parts 144A, a plurality of transmission parts 144B, a plurality of second optical surfaces 145 and a plurality of third optical surfaces 146. In the present embodiment, four first optical surfaces 141, four second optical surfaces 145 and four third optical surfaces 146 are provided. In addition, in the present embodiment, eight second reflection parts 144A are provided.

Effect

Optical module 200 according to the present embodiment can support multichannel-light transmission that entails monitoring, while achieving the effects of Embodiment 1.

This application is entitled to and claims the benefit of Japanese Patent Application No. 2018-152641 filed on Aug. 14, 2018, the disclosure each of which including the specification, drawings and abstract is incorporated herein by reference in its entirety.

Industrial Applicability

The optical receptacle and the optical module according to the embodiment of the present invention are suitable for optical communication using an optical transmission member.

REFERENCE SIGNS LIST 100, 200 Optical module
120, 220 Photoelectric conversion device
121 Substrate
122 Vertical-cavity surface-emitting laser
123 Detection device
124 Light-emitting surface
125 End surface
126 Light reception surface
140, 240 Optical receptacle
141 First optical surface
142 Reflection surface
143 First reflection part
144 Light separation part
144A Second reflection part
144B Transmission part
145 Second optical surface
146 Third optical surface
160 Optical transmission member
162 Ferrule
L Emission light
Lm Monitor light
Ls Signal light

What is claimed is:

1. An optical receptacle configured to optically couple a vertical-cavity surface-emitting laser and an end surface of an optical transmission member in a state where the optical receptacle is disposed between the optical transmission member and the photoelectric conversion device, the photoelectric conversion device including the vertical-cavity surface-emitting laser and a detection device configured to monitor light emitted from the vertical-cavity surface-emitting laser, the optical receptacle comprising:

a first optical surface configured to allow incidence of light emitted from the vertical-cavity surface-emitting laser;

a first reflection part configured to reflect, as monitor light travelling toward the detection device, a part of light entered from the first optical surface;

a light separation part configured to separate another part of the light entered from the first optical surface into monitor light travelling toward the detection device and signal light travelling toward the end surface of the optical transmission member;

a second optical surface configured to emit, toward the end surface of the optical transmission member, the signal light separated at the light separation part; and a third optical surface configured to emit, toward the detection device, the monitor light reflected by the first reflection part and the monitor light separated at the light separation part, wherein the light separation part includes:

two second reflection parts tilted to an optical axis of the light entered from the first optical surface, the two second reflection parts being configured to reflect a part of light incident on the light separation part toward the third optical surface as the monitor light travelling toward the detection device, and a transmission part disposed at least between the two second reflection parts, and configured to transmit, as the signal light, another part of the light incident on the light separation part; and wherein the two second reflection parts are disposed within a light flux of the light entered from the first optical surface to satisfy a following installation method of the two second reflection parts, the installation method of the two second reflection parts of the two second reflection parts comprising:

(1) determining a first curve, the first curve representing a relationship between an angle to a normal passing through a center of a light-emitting surface of the vertical-cavity surface-emitting laser in a cross-section that includes the normal and is parallel to an arrangement direction of the two second reflection parts, and a light intensity of light emitted from the light-emitting surface when a maximum available current is applied to the vertical-cavity surface-emitting laser, wherein a direction along the normal is set to 0° in the cross-section;

(2) determining a first maximum value and a second maximum value in the first curve, the first maximum value being a maximum value of a light intensity in a minus region of the angle, the second maximum value being a maximum value of a light intensity in a plus region of the angle, wherein in the first curve, the angle to the normal on one side with respect to the normal in the cross-section is set as minus, and the angle to the normal on another side with respect to the normal in the cross-section is set as plus;

(3) determining a second curve, the second curve representing a relationship between the angle to the normal in the cross-section and the light intensity of the light emitted from the vertical-cavity surface-emitting laser when an available minimum current is applied to the vertical-cavity surface-emitting laser, wherein the direction along the normal is set to 0°;

(4) determining a first minimum difference angle, the first minimum difference angle being an angle corresponding to a state where a difference between a light intensity in the first curve and a light intensity in the second curve is smallest in a range from an angle of 0° to an angle corresponding to the first maximum value;

(5) determining a second minimum difference angle, the second minimum difference angle being an angle corresponding to a state where a difference between the light intensity in first curve and the light intensity in second curve is smallest in a range from the angle of 0° to an angle corresponding to the second maximum value; and (6) disposing the two second reflection parts at arrival positions of light emitted at the first minimum difference angle and light emitted at the second minimum difference angle.

2. The optical receptacle according to claim 1, further comprising a reflection surface disposed on a light path between the first optical surface and the first reflection part, and a light path between the first optical surface and the light separation part, the reflection surface being configured to reflect, toward the first reflection part and the light separation part, the light entered from the first optical surface.

3. An optical module, comprising:
   a photoelectric conversion device including a substrate, a vertical-cavity surface-emitting laser disposed on the substrate, and a detection device disposed on the substrate and configured to monitor emission light emitted from the vertical-cavity surface-emitting laser; and
   the optical receptacle according to claim 1.

4. An optical module, comprising:
   a photoelectric conversion device including a substrate, a vertical-cavity surface-emitting laser disposed on the substrate, and a detection device disposed on the substrate and configured to monitor emission light emitted from the vertical-cavity surface-emitting laser; and
   the optical receptacle according to claim 2.

* * * * *